United States Patent [19]

Dennison et al.

[11] Patent Number: 4,884,240
[45] Date of Patent: Nov. 28, 1989

[54] STATIC ROW DRIVER

[75] Inventors: Stanley M. Dennison, Jonesborough; Cordell E. Prater, Johnson City, both of Tenn.

[73] Assignee: Texas Instruments Incorporated, Dallas, Tex.

[21] Appl. No.: 876,140

[22] Filed: Jun. 19, 1986

[51] Int. Cl.[4] .............................. G11C 7/00
[52] U.S. Cl. ................................ 365/189.09
[58] Field of Search ...................... 365/189, 230

[56] References Cited

U.S. PATENT DOCUMENTS 4,150,441 4/1979 Ando ............................... 365/189
4,635,233 1/1987 Matsumato et al. ............. 365/189

Primary Examiner—James W. Moffitt
Attorney, Agent, or Firm—Ferdinand M. Romano; Melvin Sharp; Thomas W. DeMond

[57] ABSTRACT

A static row driver for an array of memory cells which includes a plurality of NAND gates each having a pair of row line driver input signals, an inverter coupled to an output of each of the NAND gates, a switch coupled to an output of each of the inverter circuits and a switch control coupled to each of the switches for opening an associated switch and passing the signal from a corresponding inverter output to an associated row line.

4 Claims, 2 Drawing Sheets

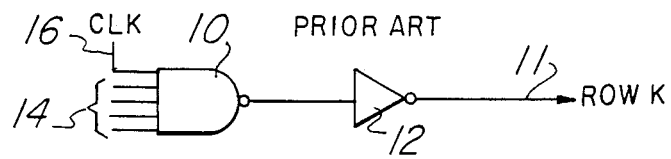
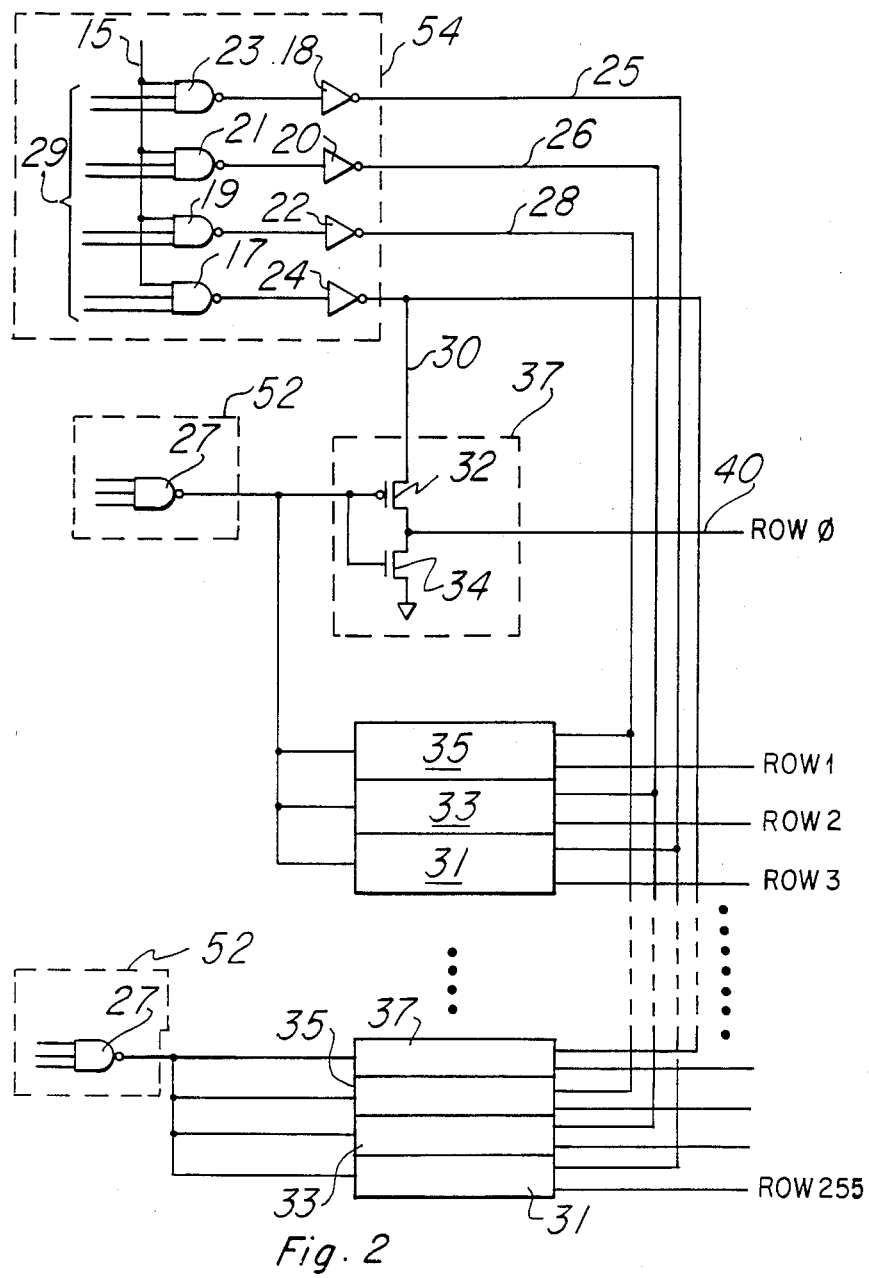

STATIC ROW DRIVER

BACKGROUND OF THE INVENTION

The present invention relates to a static row driver used for generating row drive signals from a plurality of address lines.

Although there are a variety of row driver circuits for memory cell arrays there is a need for one which combines reliability, good performance and the capability of being laid out in small dimensions when incorporated into VLSI technology. For example, a present day ROM array may have ROM bits laid out in a 6 micron by 6 micron size. In order to maximize the small size advantage of such circuits it is desirable to be able to build a row driver that can be laid out in groups of rows having a small pitch and at the same time enjoy good performance.

Accordingly, it is an object of the invention to provide a row driver circuit with good performance and reliability that can be laid out on the face of a semiconductor substrate with small dimensions.

SUMMARY OF THE INVENTION

According to the invention there is provided a static row driver for an array of memory cells which includes of 1 of 64 decoder for enabling 1 of 64 groups of row lines in an array, a 1 of 4 decoder for selecting 1 of 4 rows in each of the 64 groups, and row grounding means for grounding three of the four non-selected rows in the enabled group of 4 rows.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

FIG. 1 is a circuit diagram of a previous circuit which is used to decode each row of an array;

FIG. 2 is a circuit diagram of a circuit which uses only one NAND gate for each four row lines plus an additional four for the array.

DETAILED DESCRIPTION WITH REFERENCE TO THE DRAWINGS

Figure 3:
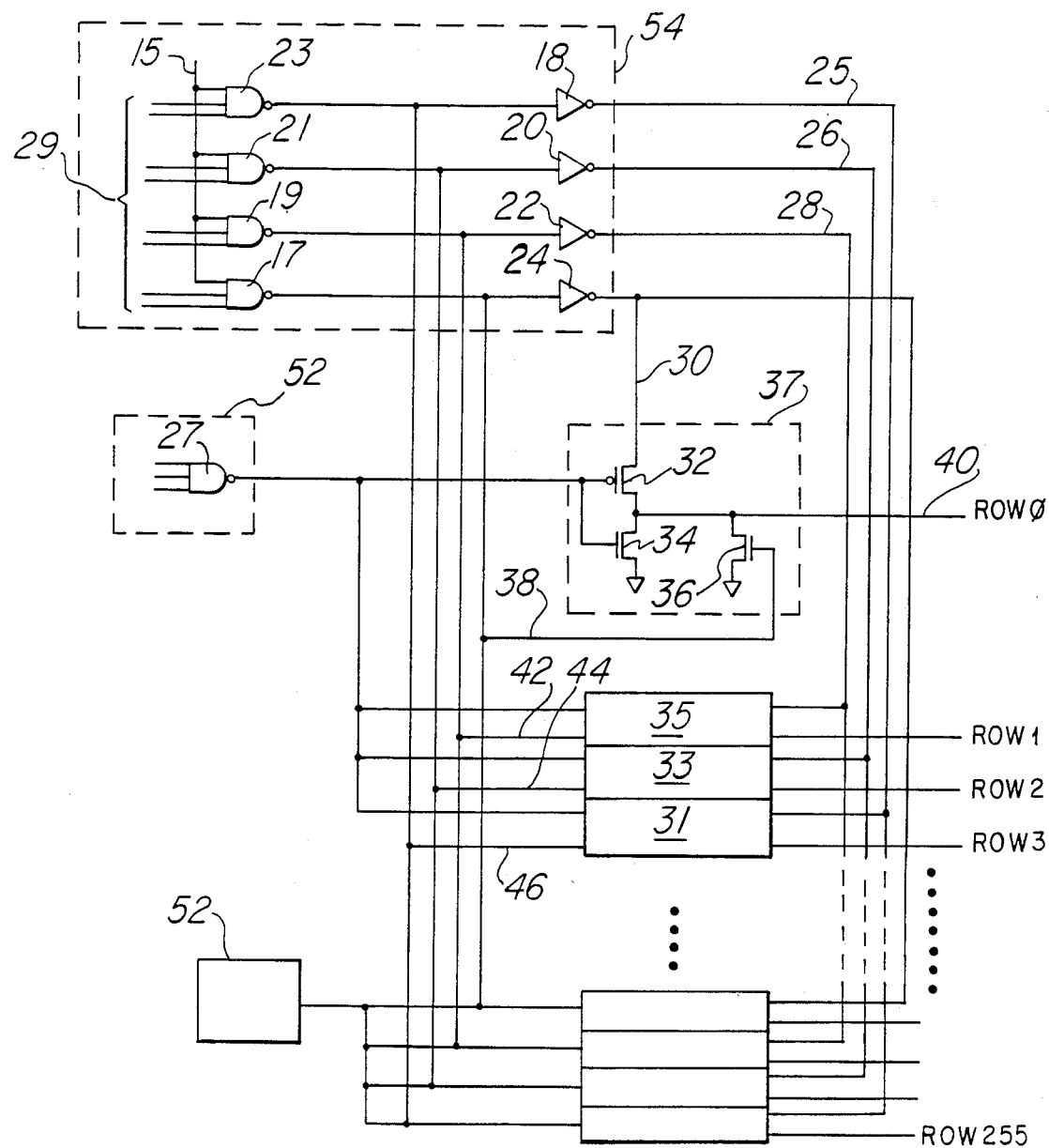
FIG. 3 is a circuit diagram of a circuit similar to that of FIG. 2 which utilizes a pull down transistor to avoid leaving non-selected row lines floating.

Referring to FIG. 1, previous row line driver circuits utilized a NAND gate 10 followed by an inverter 12 to drive a row line 11 in this case designated as row k. The NAND gate 10 has 4 inputs 14 from an address decoder (not shown) and a fifth clock input 16. The 5 inputs of the NAND gate 10 require it to be relatively wide while at the same time the use of 1 NAND gate per row requires each such NAND gate to be laid out on the same pitch as the memory cells in each row. Obviously, the presence of this number of inputs for one NAND gate per row places a severe restriction on the size or total pitch of each row.

One solution to the problem is to combine decoders such as a 1 of 64 decoders with a 1 of 4 decoder as shown in FIG. 2. In FIG. 2 a 1 of 4 decoder is made up of NAND gates 17, 19, 21, and 23 feeding corresponding inverters 24, 22, 20, and 18, respectively. Each NAND gate 17, 19, 21, and 23 has a pair of inputs 29 and a third clock input 15. Inverters 18, 20, 22 and 24 drive respective lines 30, 28, 26 and 25 which are each coupled to a drain of a P-channel transistor 32 of a corresponding one of driver circuits 31, 33, 35, and 37 respectively. Transistor 32 is coupled in series with N-channel transistor 34 to ground. Transistors 32 and 34 form an inverter which is driven by an output of 1 of 64 decoders 52 each having three inputs from address predecoders (not shown). There is one row driver circuit, for example, 37 per row, one NAND gate 27 for each 4 rows, and one 1 of 4 decoder circuit 54 for the array. The configuration of FIG. 2 allows each NAND gate 27 to be laid out on a pitch up to 4 times the pitch of the memory cells (not shown). The circuit of FIG. 2 although not limiting of the potential miniaturization of the memory cell pitch presents a potential problem due to the fact that three of the row lines are left floating during the access. This occurs due to P-channel transistor 32 being unable to pass ground potential onto its corresponding row line when its gate is at ground due to its non-zero threshold voltage. Because of capacitive coupling to the bit lines, the floating row lines are susceptible to charge injection into the substrate which can cause corrupted data or even CMOS latchup.

The foregoing problem is remedied by the circuit of FIG. 3 in which like parts to the circuit of FIG. 2 are designated with like reference numbers.

Referring to FIG. 3, in addition to the circuit elements shown in FIG. 2, there are four lines 38, 42, 44, and 46 which are taken from the outputs of NAND gates 17, 19, 21, and 23, respectively, and which are directed to the gate of a transistor 36 of a driver circuits 37. Transistor 36 is coupled between output 40 and ground.

In operation a "1" on both input lines of one of the NAND gates 17, 19, 21, and 23, say for example that of NAND gate 17, results in the corresponding NAND gate output going high when clock 15 goes high. The output of inverter 24 goes low. Assuming the output of NAND gate 27 is low due to one or more of the three address decoders (not shown) being high then transistor 32 whose gate is driven low by the output of NAND gate 27 passes the high level of the signal onto row line 40. When the output of NAND gate 27 is high due to any one of three input lines being low, it turns off transistor 32 and turns on transistor 34 grounding line 40.

Alternatively, if the output of NAND gate 17 is high due to a "0" on one or both of its inputs then transistor 36 is turned on grounding row 0 line 40 thereby ensuring that the latter is not left floating. Thus, NAND gate 27 enables driver circuits 31, 33, 35 and 37 with a low output and disables them when its output is high. Moreover, all rows are statically driven; one row through transistor 32, two hundred fifty two through transistor 34 and three through transistor 36. In the circuit of FIG. 2, whenever NAND gate 27 enables a block of 4 row drivers, the three not selected by the 1 of 4 decoder 54 leave the corresponding row lines floating.

It will be appreciated that the row lines are driven by full voltage levels since there are no floating nodes in the driver circuit. The circuit can be laid out in groups of four rows on a 24 micron pitch for an average width of 6 microns per row. Other groupings are obviously possible.

While this invention has been described with reference to an illustrative embodiment, this description is not intended to be construed in a limiting sense. Various modifications of the illustrative embodiment, as well as other embodiments of the invention, will be apparent to persons skilled in the art upon reference to this description. It is, therefore, contemplated that the appended claims will cover any such modifications or embodiments as fall within the true scope of the invention.

What is claimed is:

1. A CMOS static row driver circuit for an array of memory cells having 2N row lines configured in 2N/k groups of k rows to select one row line in a group with decoders, said circuit comprising:

a plurality of P-type transistors each connected to control current flow through one of the 2N row lines each P-type transistor having a first source/drain electrode connected to a row line, a second source/drain electrode and a gate electrode; 2N/k decoders each connected to a group of k row lines to effect selective provision of charge to one row line in a group, each decoder capable of providing an input signal to the gate electrode of any P-type transistor in the group;

k additional decoders each connected to selectively provide current flow through a different row line in every group, each of said additional decoders coupled to the second source/drain electrode of a different P-type transistor in each of the 2N/k groups;

a first plurality of N-type pull down transistors each having a first source/drain electrode coupled to a row line, a second source/drain electrode coupled to a reference potential and a gate electrode, said first plurality of N-type pull down transistors arranged in groups of k transistors with all of the gate eletrodes of the transistors in each group connected to one of the 2N/k decoders; and a second plurality of N-type pull down transistors each having a first source/drain electrode coupled to a row line, a second source/drain electrode coupled to a reference potential and a gate electrode, said second plurality of N-type pull down transistors arranged in groups of k transistors with each of the gate eletrodes of the transistors in a group connected to a different one of the k decoders.

2. The CMOS static row driver circuit of claim 1 wherein each of the k additional decoders comprises a NAND gate coupled through an inverter to the second source/drain electrode of a different P-type transistor in each of the 2N/k groups.

3. The CMOS static row driver circuit of claim 1 wherein when a row line in one group is selected the first plurality of N-type pull down transistors serves to ground each row line in the other groups.

4. The CMOS static row driver circuit of claim 1 wherein when one of the k row lines in a group is selected the second plurality of N-type pull down transistors serve to ground each of the k-1 other row lines in the group.

* * * * *